Jan. 21, 1969 E. E. SEGERSON 3,423,516

PLASTIC ENCAPSULATED SEMICONDUCTOR ASSEMBLIES

Filed Dec. 26, 1967

INVENTOR.
Eugene E. Segerson

BY

Mueller, Aichele & Rauner

ATTY'S.

United States Patent Office 3,423,516

Patented Jan. 21, 1969

3,423,516

PLASTIC ENCAPSULATED SEMICONDUCTOR ASSEMBLIES

Eugene E. Segerson, Tempe, Ariz., assignor to Motorola, Inc., Franklin Park, Ill., a corporation of Illinois Continuation-in-part of application Ser. No. 564,818, July 13, 1966. This application Dec. 26, 1967, Ser. No. 700,312

U.S. Cl. 174—52 10 Claims

Int. Cl. H05k 5/100

ABSTRACT OF THE DISCLOSURE

A high heat dissipating semiconductor device having a large heat sink metallic portion exposed with plastic encapsulating material thereabout. A semiconductor unit is mounted directly on the heat sink such that high heat dissipation is provided. Electrically insulated apertures formed in the heat sink portion and in the plastic encapsulating material facilitate mounting the device. The heat sink portion is integrally formed with a lead having an offset such that the lead can extend from the assembly midway between the device opposed major surfaces. Other leads extend outwardly of the assembly in parallel relation to the one lead.

*Related application*

Figure 1:
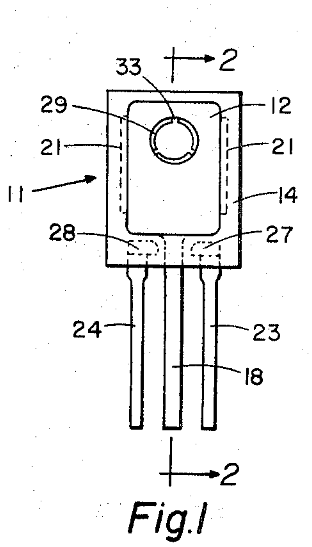

This application is a continuation in part of application Ser. No. 564,818, filed July 13, 1966, now abandoned, and reference is also made to a prior application owned by applicant's assignee, Motorola, Inc., of Robert W. Helda and Milan L. Lincoln, Ser. No. 465,123, filed June 18, 1965, which issued as a patent on Dec. 3, 1968.

*Background of the invention*

This invention relates to semiconductor devices encapsulated in a plastic material and more particularly to improved semiconductor power devices, such as power transistors and thyristors in which substantial amounts of internally generated heat must be dissipated during the device operation.

Because of the active element, commonly called a die, of a semiconductor device is very small, the removal from the die of heat generated during the operation of the device has consistently been an important consideration in the overall device construction. Previously, a metal encapsulating medium having high heat conducting capabilities was generally utilized for power devices because it could effectively dissipate this heat.

With plastic encapsulation, the dissipation of heat through the plastic packaging medium is substantially reduced because of the relatively poor heat transferring properties of plastic. To remove this heat, metal tabs that protrude from one end of the plastic package have been provided in the prior devices for coupling to a larger heat sink. Generally, a large metal tab is utilized, because the flow of heat from the die of the device is indirect and through a substantial length of reduced cross section having relatively poor heat transferring properties before reaching the heat sink. Accordingly, the size of the package is substantially increased to compensate for this metal tab.

*Summary of the invention*

An object of this invention is to reduce the overall size of a plastic encapsulated semiconductor power device while at the same time increasing the power handling capabilities of the device.

Another object of this invention is to provide a plastic encapsulated semiconductor power device wherein satisfactory heat dissipation during operation of the device is achieved through a metal heat dissipating surface which is an integral part of a metal element of the complete device, and yet lays wholly within the outlines, or outside dimensions of the plastic encapsulation, and thus has no external portions extending outside the outlines of the plastic housing.

A further object of this invention is to provide a device wherein the forming and handling of the metal portion is automated, and the plastic encapsulation is performed with maximum automation, and yet the molding can be accomplished to provide an exposed metal surface flush with the outline of the molded plastic but within the outline of a molding cavity so as to make a simple molding operation possible.

A feature of the invention is the provision of a plastic encapsulated semiconductor power device in which a major portion of one face of the device includes a surface of a metal mounting portion utilized for supporting the semiconductor die. An opening normal to the surface of the mounting portion extends entirely through the device for affixing that surface to metal in the mounting of the device. This surface is flush with the plastic comprising the balance of the face of the device package, and a larger body of metal or mounting means may serve as a large heat sink, when the device is mounted.

*The drawings*

Figure 2:
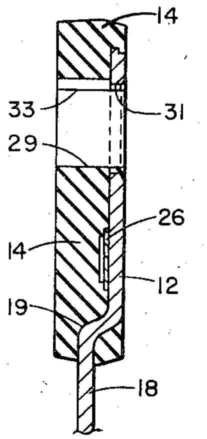
Figure 7:
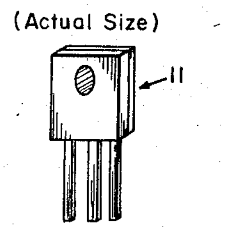
Figure 3:
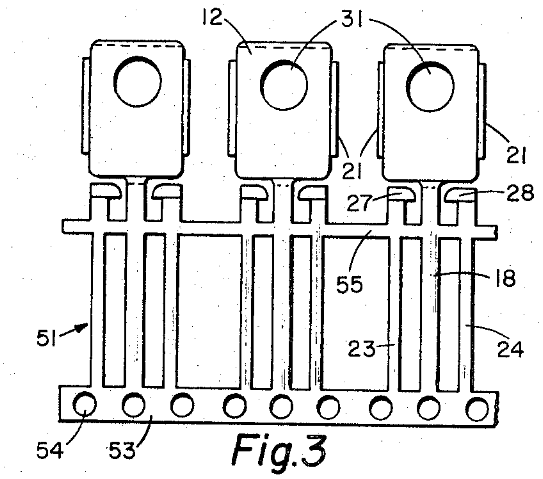
Figure 4:
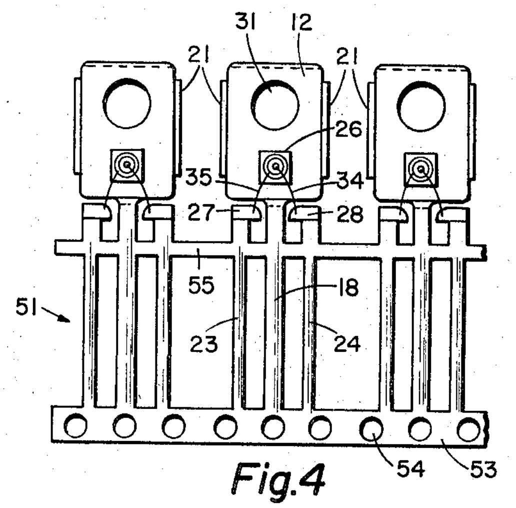
Figure 5:
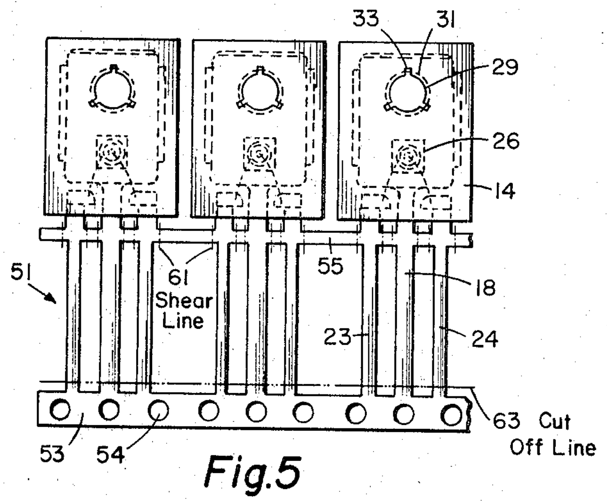
Figure 6:
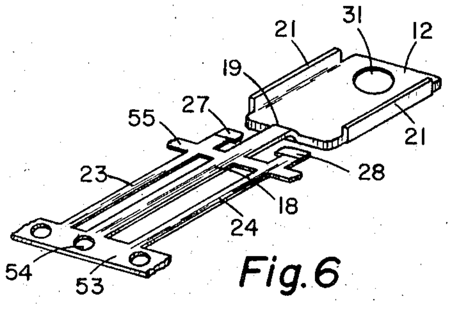

In the accompanying drawings:

FIG. 1 is an enlarged plan view of the bottom face of a transistor device embodying the invention, FIG. 2 is a view in section along line 2—2 of the device shown in FIG. 1, but enlarged and giving greater detail of the internal structure of the device, FIG. 3 is a plan view of a continuous integral metallic strip in the form utilized in the automated assembly of semiconductor devices, and showing a plurality of joined metallic groups that are cut apart after encapsulation to form the individual devices shown in full and dotted lines in FIG. 1, FIG. 4 is the metallic strip shown in FIG. 3 with semiconductor device affixed to mounting portions, joined by fine wires to integral lead portions of the strip, FIG. 5 is a transparent view of the metallic strip of FIG. 4 after a plastic encapsulation has been disposed about the die, fine wires and adjacent metallic portions of each device group, and is readly to be sheared to produce the device of FIG. 1, FIG. 6 is an enlarged perspective view of a group of joined metallic portions that is part of the continuous metallic strip shown in FIG. 3, and FIG. 7 is a perspective view in actual size of one commercial embodiment of the invention.

*Description of the illustrative embodiment*

The invention is embodied in a semiconductor device primarily for use as a power unit requiring substantial dissipation of internally generated heat. The device is comprised of three adjacent but physically separated metallic members lying in substantially a single plane with at least one of the members terminating at one end in a mounting portion displaced from this original plane and substantially larger than the balance of the members. The mounting portion has a first and a second surface and includes an opening extending therethrough. The other members terminate in the original plane adjacent to but spaced longitudinally away from the mounting portion. All metallic members extend parallel to one another longitudinally away from the mounting portion to form leads for joining the device to an electrical circuit. A semiconductor die is positioned on the mounting portion at the first surface and is connected electrically to the metallic members by wires. A plastic encapsulation is disposed about the die connecting wires and the immediately adjacent parts of the metallic members. The encapsulation is formed so that substantially the entire second surface of the mounting portion is exposed. An opening in the plastic connects with the opening in the mounting portion for receiving a bolt or other fastening to mount the device on a metal surface in electrical equipment.

A semiconductor device 11 (FIG. 1) has, on a face thereof that would conventionally be mounted adjacent to a metal chassis, an exposed surface of a large metal mounting portion 12. This surface is surrounded by plastic 14 which forms the encapsulation for the device. A semiconductor die (not visible in this view) is mounted directly on mounting portion 12 so that there is good heat transfer between the two, although the die may be electrically insulated therefrom. When assembled in electrical equipment this exposed surface is generally coupled with a large heat sink to provide for the rapid and efficient removal of heat generated internally during the operation of the device.

Mounting portion 12 is integral with a lead 18 extending outwardly from the device in one direction, and in a plane different than lead 18 so that this lead may be electrically insulated from the larger heat sink to which the device is attached as shown in FIG. 2. These two portions are connected by an offset bend 19 formed in the metallic member.

To aid in the retention of mounting portion 12 in plastic 14, a flange 21 of mounting portion 12 is extended upwardly in such a manner that the plastic grips it firmly when the plastic cures in the molding operation. In device 11, two parallel flanges 21 on opposite sides of the exposed surface are utilized for this purpose, and each extends inwardly into the plastic material.

Two other leads 23 and 24 extend outwardly from plastic 14 substantially parallel to lead 18. Leads 23, 24 terminate in wire bonding pads 27, 28 which are sections that have been enlarged to facilitate the bonding thereto of the fine wires utilized in assembling device 11. Pads 27, 28 are in close proximity to mounting portion 12 and in the same plane as leads 23, 24. These enlarged areas are enclosed in the plastic encapsulation of the final device.

Although device 11 has three leads, the invention is not to be construed as being limited to this number as it is evident that the number of leads may be readily increased. All of these leads are fabricated from a metal having very low electrical resistance and very high thermal conductivity, and preferably comprise a base metal of copper plated with nickel for corrosion resistance and facilitating the assembling operation.

Plastic 14 is preferably a low shrink filled epoxy material suitable for transfer molding. In choosing a plastic, its compatibility with the components of the device and the stability of the device encapsulated therein when aged and subjected to wide variations in environmental conditions are two considerations of prime importance.

A plastic suitable for transfer molding is preferred because the resulting encapsulation is uniform, void-free, and tightly sealed about the elements of the device. Epoxies and silicones, with or without fillers, are preferred, although many other well known plastics with similar properties may be utilized.

In transfer molding the plastic encapsulation for the present device, heat and pressure are applied to convert the plastic which is normally in a solid state, into a very low viscosity liquid which is then rapidly transferred from one mold chamber into another normally comprising the final package shape. Because of this low viscosity and the nature of the transfer molding, high pressures may be utilized without damaging the delicate parts associated with semiconductor devices. With the uniform mass formed by transfer molding the plastic encapsulation, the elements of device 11 are held in a rigid fixed relationship and generally are not subject to damage by vibrations and shocks.

The bottom surface of mounting portion 12 (FIG. 2) is flush with the bottom surface of plastic 14 so that when mounted on a chassis or other structure intimate contact is maintained therebetween. This provides a large heat transferring surface for dissipating heat vertically and laterally from a die 26 mounted on mounting portion 12. The resulting effect is as if the die were mounted directly on the larger heat sink giving nearly ideal heat transferring properties.

Die 26 is a chip of silicon having two major faces, wherein one face comprises the collector of a transistor, and the other face comprises the emitter and base. Although die 26 is fabricated from silicon, it can also be fabricated from other semiconductor materials.

The amount of heat that may be dissipated by a unit is effectively the amount that may be transferred across the boundary of this one major face. The mounting of die 26 in this manner on mounting portion 12 results in the direct flow of heat from one face of die 26, the collector in this transistor, through the mounting portion to, as is usually the situation, a larger heat sink. This short, direct path for the heat transfer takes full advantage of the maximum heat transferring area of the die.

Device 11 is conveniently mounted by inserting a bolt or other fastener through opening 29 in plastic 14 that connects with an opening 31 in mounting portion 12. The diameter of opening 29 is less than the diameter of opening 31 to electrically insulate the fastener from mounting portion 12. It should be noted that plastic 14 extends through and covers the exposed metal in opening 31 to provide complete insulation. The bottom edge of opening 31 is beveled to facilitate the grasping and holding of the plastic thereon. The metal of mounting portion 12 is partially exposed in the three solts 33 (FIG. 1), but because of the freater diameter or opening 31, the insulating effect of plastic 14 is preserved.

The fabrication of semiconductor device 11 according to the invention is facilitated by the use of a metal strip 51 (FIG. 3) that has been punched to form a plurality of interconnected groups of individual metallic members included in the final device. Each group includes mounting portion 12, wire bonding areas 27, 28 and external leads 18, 23, 24. The groups are joined by a heavy connecting band 53 with a plurality of openings 54 therein that are utilized to position the groups during the assembling steps as the strip is moved through assembly machinery. To retain the individual members of device 11 in a set relationship during the assembling steps, a tie strip 55 is provided immediately below the portion of device 11 ultimately covered by plastic 14. Metal strip 51 is conveniently punched or formed by other commonly used metal forming techniques at a relatively low cost when compared to the cost of piece parts serving a similar function in previous device structures. With the use of strip 51, the fabrication of device 11 is highly mechanized and the cost thereof reduced. The assembly machinery utilized has an indexing means that functions in conjunction with openings 54 to consistently and precisely position the groups of metallic members for each step of the fabrication.

A strip 51 is inserted in a die bonder (not shown) and the first group aligned with mounting portion 12 under the die bonding needle. Once an initial alignment is made, the balance of the mounting portion 12 is automatically aligned under the needle in a progressive operation. Die 26 (FIG. 4) is bonded in a preselected location on each mounting portion 12 toward the edge thereof near tie strip 55 and on the center line of the appendage. Die 26 is adjacent to offset bend 19 connecting mounting portion 12 with integral lead portion 18. Many techniques of die bonding are known and will not be described herein.

Strip 51 with die 26 bonded thereto, corresponding in number to the groups of metallic members in the strip, is transported as a unit to a wire bonding machine (not shown). An alignment is made on the first group and a fine wire 34 is bonded to die 26 and wire bonding area 28. The wire bonding is progressively repeated for each group on strip 51. At the completion of one pass of the strip through the wire bonder, the first group is again positioned under the wire bonder and the operation repeated to bond a wire 35 to wire bonding area 27. Fine wires 34, 35 electrically couple the emitter and base electrodes of the transistor to their corresponding external leads. The ease and rapidity with which die 26 is mounted and fine wires 34, 35 are connected, clearly evidence the efficient and inexpensive nature of this type of assembly.

Strip 51, now including the partially assembled transistor devices, is removed from the wire bonder and transported to a transfer mold (not shown) for plastic molding. The number of groups formed in a strip is usually selected so that the entire strip may be positioned in the transfer mold as a single unit and the mold closed thereabout to form individual mold cavities about each group of metallic members. Included in the cavity is mounting portion 12, die 26, fine wires 34, 35, wire bonding areas 27, 28, and adjacent portions of leads 18, 23, 24.

To plastic encapsulate the illustrated embodiment of the invention, the mounting portion 12 may be disposed on one face of a mold (not shown). The semiconductor die and flanges 21 face the opposing die face. The opposing die face has a core pin (not shown) extending toward the first mentioned die face for forming aperture 29 in the plastic encapsulation. Such core pins are well known in the plastic encapsulating art. Such core pins may be a moveable ejector-type pin or a non-moveable core pin on the moveable die part. On the outward end of the core pin, a core pin cap with three radially extending flanges is fixed. This is a part of the core pin that will wear and it is made removeable to reduce maintenance cost of the mold. For the illustrative embodiment the core pin cap (not shown) has three radial flanges for forming the three grooves 33 in the plastic encapsulation. The core pin cap flanges engage the mounting portion 12 about the periphery of aperture 31 and force mounting portion 12 securely against the one die face. The pressure exerted on mounting portion 12 by the core pin cap is preferably greater than the pressure of the fluid plastic encapsulating material to be forced into the mold cavity. In this manner, no plastic encapsulating material flows between mounting portion 12 and the supporting die part face. Referring to FIG. 5 of a drawing, it is seen that the grooves 33 expose a small portion of one surface of mounting portion 12. Such exposed portions constitute about ½ the depth of the respective grooves, which means a mounting bolt is still insulated for mounting portion 12. Therefore in fabricating the device such as illustrated in the attached drawing, the fabrication is facilitated to have both sides of mounting portion 12 exposed at least to some degree for permitting high pressures to be exerted on the mounting portion during plastic encapsulation. It is to be understood that mounting portion 12 may have upstanding members thereon for receiving the core pin cap so long as the compressive strength of such upstanding members is greater than the molding pressure of the fluid plastic encapsulating material. In fact, the exposed portion of member 12 in grooves 33 may be flush with one surface of plastic encapsulating material 14.

Another method of fabrication includes stripping plastic encapsulating material from portion 12 after the encapsulated device is removed from the mold. Such latter method is well known.

With the mold closed, a fluid epoxy material is transferred into the cavities to form individually encapsulated devices. The thermosetting epoxy material cures rapidly, and a dense, solid plastic encapsulation securely and tightly sealed about the protruding metallic members, is formed (FIG. 5). A strip of interconnected completed devices 11, having formed therein opening 29 connecting with opening 31, is removed from the mold. The plastic material does not cover the bottom surface of mounting portion 12 so that upon removal from the mold, this surface is exposed and flush with the surrounding face of plastic 14.

Strip 51 is transported to a metal shear where it is separated along shear line 61 and cut off line 63 to complete the fabrication of individual transistor device 11. These devices are catagorized according to their electrical characteristics to complete the fabrication steps.

The relative position of flange 21 to mounting portion 12 is shown in the perspective view FIG. 6. Flange 21 is integral with mounting portion 12 and extends upwardly into the plastic encapsulation to aid in retaining the mounting portion therein and the formation of a satisfactory seal thereabout. Also, in FIG. 6 the relative planes of the mounting portion 12 and leads 18, 23, 24 are readily observed. Mounting portion 12 is joined to lead 18 by offset bend 19 that is advantageously formed during the stamping of the metallic strip.

In FIG. 7, an actual size representation of a 50-watt transistor having a structure according to the invention is shown. The face dimensions of the plastic encapsulation are about ½ by ⅝ inch and the depth about ⅛ inch. With a prior metal tab structure, a package this size could only accommodate a 15-watt unit. Because of the improved heat transferring properties of the novel device of this invention, a 15-watt unit is readily accommodated in a package similar in appearance to the 50-watt unit having face dimensions of about ¼ by ⅜ inch and a 1⁄16 inch depth, representing a substantial reduction in size.

With the improved heat transfer capabilities of the device according to the invention, packages smaller than those described above are feasible. Factors such as the temperature of the heat sink and the commercially acceptable package size influence the selection of the final dimensions. It is understood that the physical package configuration and the number of leads utilized may be readily altered within the scope of the invention.

The upstanding flanges 21 are preferably at an angle other than 90° to provide a tight seal between the plastic encapsulating material and mounting portion 12. As the plastic material shrinks during the curing cycle, the material is drawn into compression rather than shrinking along the flanges, when upright. For example, the flanges may extend outwardly of mounting portion 12 at an angle between 90° and 45°. Angles between 75° and 85° have been successfully used. Such angles are measured between the plane of mounting portion 12 and the outer surfaces of the flanges, respectively.

The above description and drawings show that the present invention provides a novel semiconductor device encapsulated in a plastic material especially suited for use as a power device. The overall size of the device is reduced substantially in comparison to prior devices, while at the same time the power handling capabilities are increased. Additionally, with this novel semiconductor device the transfer of heat from the semiconductor die is accomplished in a more direct and efficient manner.

I claim:

1. In a semiconductor device particularly adapted for dissipating internally generated heat having molded plastic encapsulation for the active element thereof, the combination of a plurality of separated lead members with the portion of each lead member outside the plastic encapsulation for the device extending into such encapsulation and such portions being positioned substantially in a single plane, mounting portion means connected with one of said lead members having an area thereof which is positioned in a plane substantially parallel to the plane of said lead members but transversely displaced from the latter plane, and with said mounting portion means having an aperture therein, a semiconductor unit secured to said mounting portion means on one face thereof at said area and being conductively connected to said lead members, and a molded plastic encapsulation for said mounting portion means and for said semiconductor unit and the conductive connections therefrom which encapsulates all of the same but leaves exposed a face portion of said apertured mounting portion means opposite to the face upon which said semiconductor unit is secured, with said exposed face portion adapted for surface engagement with structure to which the device is subsequently applied, and with said plastic encapsulation having an opening therethrough at right angles to the two mentioned faces of the mounting portion means and coextensive with the aperture in said mounting portion means.

2. A molded plastic encapsulated semiconductor device according to claim 1 in which said mounting portion means has at least one flange extending into and buried in the plastic encapsulation for the device.

3. A molded plastic encapsulated semiconductor device according to claim 1 in which the opening in the plastic encapsulation is of smaller diameter than the diameter of the aperture in the mounting portion means whereby the plastic encapsulation is adapted to act as an insulator at the coextensive openings for any metal element extending through said openings.

4. A molded plastic encapsulated semiconductor device according to claim 1 in which said mounting portion means is connected to said one lead member by an offset in said one lead member to displace said mounting portion means area from the plane of said one lead member.

5. A molded plastic encapsulated semiconductor device according to claim 1 wherein said mounting portion means has two flanges upstanding thereon from the face thereof on which the semiconductor unit is secured and on each of two sides on said face and which said flanges are buried in the molded plastic encapsulation for the device.

6. In a plastic encapsulated semiconductor device particularly adapted for dissipating internally generated heat to maximize the power handling capabilities of the device, the combination of, mounting portion means with oppositely disposed faces, and with a flange at each of two opposite edges of said mounting portion means upstanding from one of said oppositely disposed faces, semiconductor means secured to said mounting portion means on said one of said faces and having a plurality of electrodes thereon, a plurality of lead means with one thereof connected to said mounting portion means and the other lead means thereof electrically connected respectively to electrodes on said semiconductor means, a unitary plastic encapsulation encapsulating said semiconductor means, said mounting portion means, and the portions of said lead means electrically connected to said semiconductor means and connected to said mounting portion means, with a face of said mounting portion means opposite to the one face upon which said semiconductor means is secured being exposed from said plastic encapsulation, said lead means each having a portion extending out of said plastic encapsulation for said device and into said encapsulation, said mounting portion means having an opening therein spaced from the semiconductor means thereon through which to fasten said device to a surface so that the heat generated in the device can pass through the exposed part of the mounting portion to such a surface, and an opening in said plastic encapsulation coextensive with said opening in said mounting portion, with the portion of all of said lead means in said unitary plastic encapsulation being buried therein and positioned in a plane displaced from the plane in which lies the face of the mounting portion means having the semiconductor means thereon.

7. The combination of claim 6 wherein said unitary plastic encapsulation is continuous over one face surface thereof and is interrupted in the opposite face surface adjacent the exposed face of the mounting portion and flush therewith to permit direct contact of said exposed face with a surface for direct conduction of heat from the device.

8. The combination of claim 6 wherein said lead means were originally a part of a single metal member having integral portions connecting said lead means to maintain the same in fixed position until the plastic encapsulation was effected and thereafter such integral portions were severed from such metal member.

9. In a plastic encapsulated semiconductor device particularly adapted for dissipating internally generated heat, the combination of, mounting portion means with oppositely disposed faces, and a flange thereon upstanding from one of said faces at an edge thereof, semiconductor means secured to said mounting portion means on said one of said faces having a plurality of electrodes thereon, a plurality of lead means with one thereof having a bent neck portion directly joined to said mounting portion means and others of said plurality of means thereof electrically connected respectively to corresponding electrodes on said semiconductor means, a unitary plastic encapsulation encapsulating said semiconductor means, said mounting portion means, said flange thereon, and the portions of said lead means electrically connected to said semiconductor means and joined to said mounting portion means, with a face of said mounting portion means opposite to said one face upon which said semiconductor means is secured being exposed at a side of said plastic encapsulation and having plastic encapsulation framing the outside edge of the exposed side, said lead means each having a portion extending out of said plastic encapsulation for said device and into said encapsulation, with the portion of said lead means in said unitary plastic encapsulation being buried therein and positioned in a plane displaced from the plane in which lies the face of the mounting portion means having the semiconductor means thereon, said semiconductor device being mountable so that said exposed side of said mounting portion means is in direct heat conduction engagement with another structure.

10. In a plastic encapsulated semiconductor device particularly adapted for dissipating internally generated heat to maximize the power handling capabilities of the device, the combination of, mounting means having oppositely disposed faces, semiconductor means secured to said mounting means on one of said faces and having a plurality of electrodes thereon, a plurality of lead means electrically connected respectively to electrodes on said semiconductor means, a unitary plastic body encapsulating said semiconductor means, said one face of the mounting means, and the portions of said lead means electrically connected to said semiconductor means, with a face of said mounting means opposite the one face upon which said semiconductor means is secured being exposed from said plastic encapsulation, said lead means each having a portion extending out of said plastic encapsulation for said device and into said encapsulation, said mounting means having an opening therein spaced from the semiconductor means thereon through which to fasten said device to a surface so that the heat generated in the device can pass through the exposed part of the mounting means to such a surface, and an opening in said unitary plastic body coextensive with said opening in said mounting means for receiving fastening means which also extends through said mounting means opening, with the portion of all of said lead means in said unitary plastic encapsulation being buried therein and positioned in a plane displaced from the plane in which lies the face of the mounting means having the semiconductor means thereon.

References Cited

UNITED STATES PATENTS 3,209,065 9/1965 Steiner -------------- 174—52.6

OTHER REFERENCES

Davidson, "Designing Potted Circuits," Electronic Design, March 1955, pp. 38 and 39 copy in group 215, 174-52 (16).

"New Semiconductors" Electronics, July 26, 1965, p. 112 copy in group 215, 174-52(16).

DARRELL L. CLAY, *Primary Examiner.*

U.S. Cl. X.R.

317—234; 29—588, 624, 628; 264—272; 174—15